United States Patent [19]

Cecchellero et al.

[11] Patent Number: 4,610,561
[45] Date of Patent: Sep. 9, 1986

[54] SECTIONAL STRUCTURE FOR CARPENTRY, PARTICULARLY TO REALIZE CUBICLES

[75] Inventors: Sergio Cecchellero, Milan; Daniele Salvatore, Cusano Milanino, both of Italy

[73] Assignee: Italtel Tecnomeccanica S.p.A., Terni, Italy

[21] Appl. No.: 687,981

[22] Filed: Dec. 31, 1984

[51] Int. Cl.$^4$ ............................................. E04H 14/00
[52] U.S. Cl. .................................... 403/171; 52/239; 52/648
[58] Field of Search .................. 52/648, 239; 403/172, 403/171, 176; 411/531

[56] References Cited

U.S. PATENT DOCUMENTS

| | | | |
|---|---|---|---|
| 2,697,873 | 12/1954 | Cooke | 411/531 |
| 3,255,721 | 6/1966 | Peterschmidt | 403/172 |
| 3,542,407 | 11/1970 | Brown | 403/172 |
| 3,864,049 | 2/1975 | Ono | 52/648 |
| 3,864,051 | 2/1975 | Reid | 403/171 |
| 3,873,219 | 3/1975 | Pofferi | 403/171 |
| 3,892,031 | 7/1975 | Bisbing | 411/531 |
| 3,901,613 | 8/1975 | Anderson | 403/171 |
| 4,027,449 | 6/1977 | Cilveti | 52/648 |
| 4,101,229 | 7/1978 | Weiball | 403/171 |

FOREIGN PATENT DOCUMENTS

| | | | |
|---|---|---|---|
| 2349169 | 8/1975 | Fed. Rep. of Germany | 403/171 |
| 2833428 | 2/1980 | Fed. Rep. of Germany | 403/171 |
| 2233882 | 1/1975 | France | 403/171 |

Primary Examiner—Henry E. Raduazo
Attorney, Agent, or Firm—Karl F. Ross; Herbert Dubno

[57] ABSTRACT

The structure has a plurality of bars and a plurality of joints. These latter mainly consist of a cubic body whose center area is hollow and communicating with each of the six faces by way of a respective clearance hole. Three such clearance holes are so structured as to receive the head of the relative screw whose shank is arranged to be screwed onto an anchoring element located inside the bars.

9 Claims, 3 Drawing Figures

SECTIONAL STRUCTURE FOR CARPENTRY, PARTICULARLY TO REALIZE CUBICLES

DESCRIPTION

The present invention relates to a sectional structure particularly for use in cabinetry, e.g. of the type adapted to support electrical or electronic devices.

BACKGROUND OF THE INVENTION

The circuits and devices needed for electrical or electronic systems are usually located inside cubicles that perform the double function of support and protection. The cubicles in question must provide mechanical sturdiness, since for safety reasons, they are usually required to be able to stand relevant stresses, including bursts or explosions, which might occur in electric energy distribution systems owing to possible short-circuits.

To comply with the mechanical sturdiness requirement, such cubicles are usually in the form of a metallic structure which is covered with panels anchored with the structure itself.

Considering that such cubicles may present a wide range of sizes, the metallic structure is usually obtained by assembling a plurality of elementary pieces from bars and iron sheets.

The assembly means usually consist of a joint which, for reasons of weight and ease of working, is usually realized in die-cast aluminum.

In fact, aluminum provides such a specific gravity as to allow to contain the weight of the joints and consequently of the structure in its whole and may be easily worked by die-casting.

According to known structures the connection of joints with the bar portions is realized by way of screws whose head is inserted into recesses provided in the bars and whose shank results screwed on threaded holes obtained in the body of the joint. In particular, the bars usually provide a polygonal section and each bar portion is linked to the joint by way of two screws located at diametrically opposite points of the said polygonal section.

Thus a fair distribution of the prestress force deriving from the tightening of the two screws is obtained from the entire contact surface between the bar portions and respective support provided on the joint.

A structure of this type has the drawback that the assembly requires a long time of assembly time since the connection of each bar with the joint involves the tightening of two screws. Furthermore, this structure allows a small number of composition-resolution operations; in fact, the said threaded holes are obtained in an aluminum body, whose resistance to the wear is much lower than that of the steel of the screws and consequently, after some composition-resolution operations, the thread deteriorates so as to render the connection no longer reliable.

OBJECT OF THE INVENTION

The object of the present invention is that to provide a sectional structure for carpentry so structured as to require short times of assembly and to allow a much higher number of composition-resolution operations than that allowed by the known structures.

SUMMARY OF THE INVENTION

According to the invention such bar portions are linked by way of joints. Each bar portion is associated with the relative face of the joint through a screw whose head is pressed against the joint and whose shank is designed to be screwed on an anchorage element, e.g. realized in steel, integral with the bar. Thus the junction involves the screwing of a single screw whose axis is substantially coincident with that of the bar and consequently a single screw allows a fair distribution of the prestress force meanwhile ensuring a better resistance to wear of the thread.

The structure according to the invention halve the assembly times in comparison with known structures and allows a high number of composition-resolution operations without incurring excessive wear.

The sectional structure for cabinetry, therefore comprises a plurality of bars and a plurality of joints that may be linked to the bar by way of screws. The joints mainly consist of a body, whose basic shape is substantially cubic, three faces of which locating a trihedral angle providing a stem whose transversal section is complementary to the inner profile of the bars. Such a cubic body, in coincidence with its center area, provides a cavity which communicates with each of the six faces via a respective clearance hole. The clearance holes communicating with the faces of the cubic body equipped with the shanks have a diameter not less than the diamter of the shank of said screw and at the end coinciding with the cavity, such a diameter is so enlarged as to form a seat adapted to receive the head of the screw.

The structure also provides the presence of anchorage elements, equipped with a threaded hole adapted to receive the shank of said screws and placed inside the bars at a distance from the ends not inferior to the height of said stems of the cubic body.

BRIEF DESCRIPTION OF THE DRAWING

Further details of the invention will appear from the following description with reference to the accompanying drawing in which.

SPECIFIC DESCRIPTION

Figure 1:
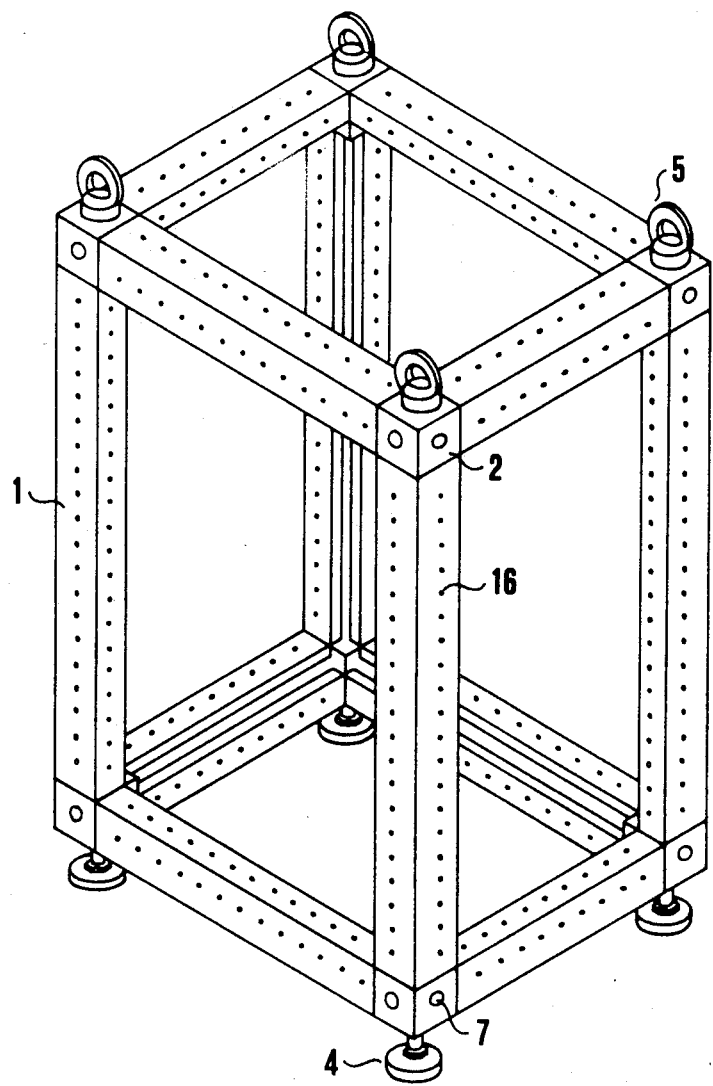
FIG. 1 is a perspective view of the structure utilizing the system according to the invention.

The structure of FIG. 1 is realized by way of a plurality of bars 1 and a plurality of joints 2.

These latter mainly consist of a cubic body 3 whose side is of a size coinciding with the outer size of the tranverse section of bars 1.

Figure 2:
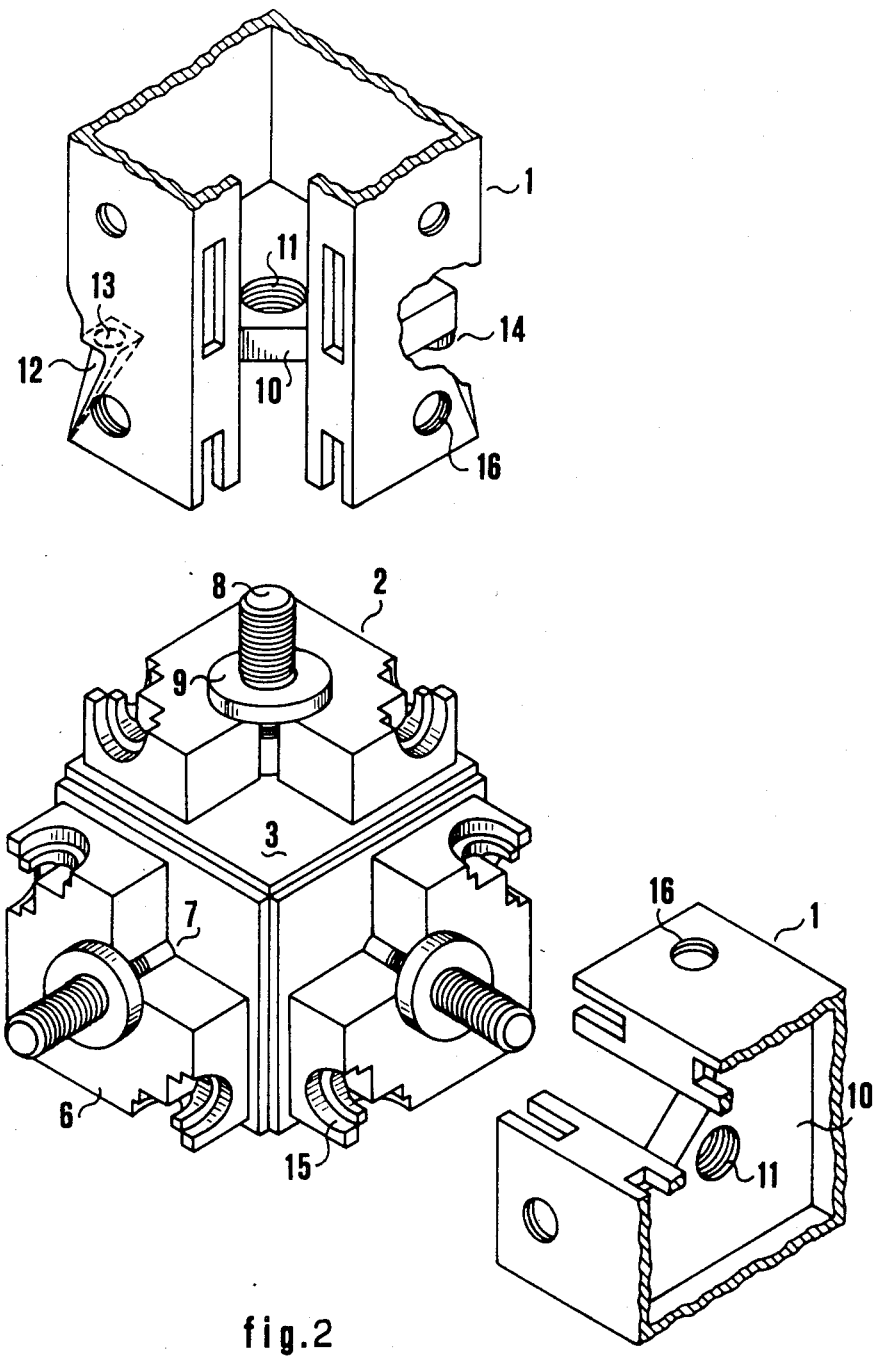
FIG. 2 shows a joint of FIG. 1 realized according to the invention, together with portions of the bars.
Figure 3:
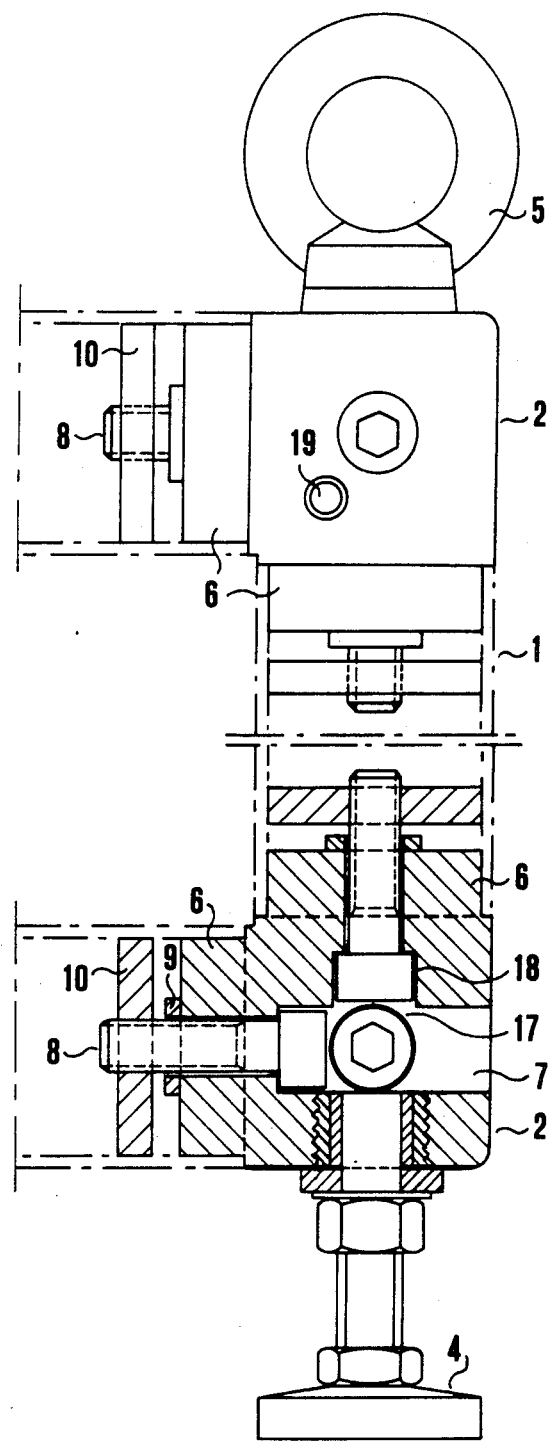
FIG. 3 shows a section of one of the joints of FIG. 1 together with a view of another joint.

Three faces of the cubic body 3 define a trihedral angle to be coupled, via means illustrated in detail in FIGS. 2 and 3, to as many bars 1.

One of the remaining three faces results to be instead adapted to receive the shank of feet 4 designed to be for instance applied to the faces of the cubic body that look down, or the shank of devices 5 adapted to allow the hoisting of the structure and designed to be applied on the faces of the cubic body that look up. FIG. 2 shows in detail one of such joints 2 together with two bar portions 1. This figure illustrates the faces of the joint destined to be joined to bars 1 and to this end, said faces provide a shank 6, whose profile coincides with the inner profile of bars 2.

The axis of any of these three faces coincides with the axis of a hole 7 which is arranged to receive the shank of a screw 8, whose head results allocated in a cavity inside the cubic body as indicated in the following description of FIG. 3. Screw 8 has a length such that a good portion thereof projects from the free end of the shanks and its shifting according to the axis is reduced on one side by the head and on the other side by an elastic ring 9; the ring is coupled to the screw when a structure composition occurs. This ring avoids before or during the composition operation or assembly the possibility that the screw will come out from the relative seat.

The structure further provides the presence of anchorage elements, e.g. consisting of a plate 10 whose shape coincides with the inner profile of bars 1. Such plates 10 are inserted inside the bars and linked thereto, e.g. through soldering, at a distance from the ends not inferior to the height of shanks 6 of the cubic body. Plate 10 provides a threaded hole 11 adapted to receive the shank of said screws 8, whose center coincides with the axis of bars 1.

According to a second embodiment of the invention plates 10 are to be coupled with bars 1 via at least a pair of stirrups 12 only illustrated by way of example in the vertical bar of FIG. 2. These stirrups 12 may be realized by way of as many drawings effected on at least two angles opposite to the bars and so structured as to provide a flat surface in coincidence with the area of contact with plate 10.

According to a further embodiment, this flat surface of depressions 12 provides a hole 13 adapted to receive a respective tooth 14 of plate 10. The adoption of said stirrups involves a change in the profile of shanks 6 which will have to provide two chamfered angles (not illustrated) so as to receive the drawings or depression of the bars.

The connection of joints 2 to bars 1 provides the coupling of the ends of bars 1 with shanks 6 which are so structured as to determine the correct displacement of the bars and consequently after the coupling, the axis of screw 8 coincides with the axis of hole 11 provided on the anchorgae plate.

At this point, by way of a tool, screw 8 is screwed into hold 11 to the extent that any slack between the end of bar 1 and the relative face of cubic body 3 is taken up and their contact is determined with a prestress force deriving from the full tightening of the screw.

Such a prestress force is fairly distributed along the whole contact surface between bar 1 and cubic body 2 since the tractive force practiced by the screw results applied on the axis of bar 1.

The figure also shows recesses 15 obtained on shanks 6 to receive the shank of screws designed to be screwed on the threaded holes 16 provided in bars 1. Such screws have for istance the task of performing the tightening of panels, when the structure is provided for the implementation of cubicles.

FIG. 3 illustrates the section of one joint 1 as well as a view of the second joint.

From said section it is evident that the center of the cubic body coincides with the center of a cavity 17 which communicates, via said holes 7, with each face of the cubic body.

In particular, the holes communicating with the faces equipped with shanks 6 provide such a diameter as to receive the shank of screws 8 and in coincidence with the end facing the cavity 17, such a diameter is enlarged so as to create a seat 18 adapted to receive the head of the screw.

The holes communicating with the remaining three faces provide instead a diameter not inferior to the diameter of the screw heads and however such that they result able to be crossed by the shank of a tool adapted to allow the screwing of the shank of said feet 4 or of the shank of said devices 5 for the hoisting of the structure (see FIG. 1).

The faces of joint 2 without shanks 6 have a further threaded hole 19 that is aligned, in an assembled structure, with holes 16 obtained on bars 1 in order to render possible, for instance, the anchorage of panels on both bars 1 and joints 2.

The advantages of the structure accord to the invention, include the speed and practicality of the assembly. The joining of a single screw by way of a tool that is easily handled owing to the fact that during such an operation its shank is perpendicular to the structure with the handgrip opposite thereto. Furthermore, this structure sets no limits to the number of composition-resolution operations which it is able to stand if the plate 10 is of steel.

We claim:

1. In a sectional structure for forming corner joints of cabinetry, particularly adapted to produce cubicles, of the type comprising a plurality of bars joined through screws to a plurality of joints, these latter each having a substantially cubic body, wherein only three faces locating a trihedral angle are formed with respective plug-type shanks of a generally polyhedral shape complementary to the inner profile of the bars, the improvement which comprises in combination with the cubic body a plurality of screws and plates in said bars threadedly receiving the screws, and wherein the cubic body is solid and in its center area is formed with a cavity which communicates with any of the six faces via a respective clearance hole, the clearance holes communicating with the faces of the cubic body providing said shanks have a diameter not less than that of shanks of said screws and an end coinciding with said cavity provide such an enlarged diameter as to create a seat adapted to receive heads of the screws, the clearance holes communicating with the faces of the body not formed with said plug-type shanks having a diameter not less than that of said heads of said screws, said plates being rigidly fixed in said bars and being flat, rigid and formed with threaded holes adapted to receive and traversed by the shanks of said screws, said elements being disposed and held inside the bars at distances from the ends thereof not less than the heights of said plug-type shanks.

2. The improvement defined in claim 1 wherein the threaded hole of each plate has an axis coinciding with the axis of the respective bar.

3. The improvement defined in claim 1 wherein at least one of said clearance holes communcating with faces of the cubic body not formed with a plug-type shank is threaded.

4. The improvement defined in claim 1 wherein an elastic ring is located on a shank of each of said screws that projects from respective plug-type shank.

5. In a sectional structure for forming corner joints of cabinetry, particularly adapted to produce cubicles, of the type comprising a plurality of bars joined through screws to a plurality of joints, these latter each having a substantially cubic body, wherein only three faces locating a trihedral angle are formed with respective plug-type shanks of a generally polyhedral shape complementary to the inner profile of the bars, the improvement which comprises in combination with the cubic body a plurality of screws and plates in said bars threadedly receiving the screws, and wherein the cubic body in its center area is formed with a cavity which communicates with any of the six faces via a respective clearance hole, the clearance holes communicating with the faces of the cubic body providing said shanks have a diameter not less than that of shanks of said screws and an end coinciding with said cavity provide such an enlarged diameter as to create a seat adapted to receive heads of the screws, the clearance holes communicating with the faces of the body not formed with said plug-type shanks having a diameter not less than that of said heads of said screws, said plates being flat, rigid and formed with threaded holes adapted to receive the shanks of said screws, said elements being disposed and held inside the bars at distances from the ends thereof not less than the heights of said plug-type shanks, said body being provided with a respective recess in each plug-type shank in an area coinciding with the prolongation of the connection line of the axis of a plurality of holes provided on the sides of a respective bar.

6. In a sectional structure for forming corner joints of cabinetry, particularly adapted to produce cubicles, of the type comprising a plurality of bars joined through screws to a plurality of joints, these latter each having a substantially cubic body, wherein only three faces locating a trihedral angle are formed with respective plug-type shanks of a generally polyhedral shape complementary to the inner profile of the bars, the improvement which comprises in combination with the cubic body a plurality of screws and plates in said bars threadedly receiving the screws, and wherein the cubic body in its center area is formed with a cavity which communicates with any of the six faces via a respective clearance hole, the clearance holes communicating with the faces of the cubic body providing said shanks have a diameter not less than that of shanks of said screws and an end coinciding with said cavity provide such an enlarged diameter as to create a seat adapted to receive heads of the screws, the clearance holes communicating with the faces of the body not formed with said plug-type shanks having a diameter not less than that of said heads of said screws, said plates being flat, rigid and formed with threaded holes adapted to receive the shanks of said screws, said elements being disposed and held inside the bars at distances from the ends therof not less than the heights of said plug-type shanks, said body being provided with threaded holes in the faces not formed with said plug-type shanks in an area coinciding with a cross point of a prolongation of a connection line of holes provided on horizontal ones of said bars and a prolongation of a connection line of holes provided on vertical ones of said bars.

7. In a sectional structure for forming corner joints of cabinetry, particularly adapted to produce cubicles, of the type comprising a plurality of bars joined through screws to a plurality of joints, these latter each having a substantially cubic body, wherein only three faces locating a trihedral angle are formed with respective plug-type shanks of a generally polyhedral shape complementary to the inner profile of the bars, the improvement which comprises in combination with the cubic body a plurality of screws and plates in said bars threadedly receiving the screws, and wherein the cubic body in its center area is formed with a cavity which communicates with any of the six faces via a respective clearance hole, the clearance holes communicating with the faces of the cubic body providing said shanks have a diameter not less than that of shanks of said screws and an end coinciding with said cavity provide such an enlarged diameter as to create a seat adapted to receive heads of the screws, the clearance holes communicating with the faces of the body not formed with said plug-type shanks having a diameter not less than that of said heads of said screws, said plates being flat, rigid and formed with threaded holes adapted to receive the shanks of said screws, said elements being disposed and held inside the bars at distances from the ends thereof not less than the heights of said plug-type shanks, each of said plates resting on a pair of stirrups provided inside a respective one of said bars at a distance from an end thereof not less than the height of a plug-type shank of the cubic body.

8. The improvement defined in claim 7 wherein said stirrups are formed by drawing in coincidence of at least two opposite angles of a respective bar, so shaped as to provide a flat surface perpendicular to the axis of the bar.

9. The improvement defined in claim 7 wherein said stirrups are formed with holes adapted to receive a respective tooth of the anchorage element.

* * * * *